United States Patent
Tsai et al.

(10) Patent No.: US 12,429,769 B2
(45) Date of Patent: Sep. 30, 2025

(54) PHOTOSENSITIVE COMPOSITION AND PHOTORESIST DRY FILM MADE THEREFROM

(71) Applicant: DUPONT ELECTRONICS, INC., Wilmington, DE (US)

(72) Inventors: Tsung-Han Tsai, Hsinchu (TW); Liyen Lin, Hsinchu (TW)

(73) Assignee: DUPONT ELECTRONICS, INC., Wilmington, DE (US)

( * ) Notice: Subject to any disclaimer, the term of this patent is extended or adjusted under 35 U.S.C. 154(b) by 0 days.

(21) Appl. No.: 17/590,026

(22) Filed: Feb. 1, 2022

(65) Prior Publication Data
US 2022/0252980 A1     Aug. 11, 2022

Related U.S. Application Data

(60) Provisional application No. 63/147,680, filed on Feb. 9, 2021.

(51) Int. Cl.
| | | |
|---|---|---|
| *G03F 7/033* | (2006.01) | |
| *C08F 212/08* | (2006.01) | |
| *H01L 21/48* | (2006.01) | |
| *H05K 3/06* | (2006.01) | |
| *H05K 3/18* | (2006.01) | |

(52) U.S. Cl.
CPC ............ *G03F 7/033* (2013.01); *C08F 212/08* (2013.01); *H01L 21/4846* (2013.01); *H05K 3/064* (2013.01); *H05K 3/18* (2013.01)

(58) Field of Classification Search
CPC .......... G03F 7/033; G03F 7/20; G03F 7/0045; G03F 7/004; G03F 7/031; H01L 21/4846; C08F 212/08; C08F 220/06; C08F 220/14; C08F 220/1807; C08F 220/283; C08F 220/286; H05K 3/0076; H05K 3/184; H05K 3/18; H05K 3/064; C09D 125/14
See application file for complete search history.

(56) References Cited

U.S. PATENT DOCUMENTS

| | | | |
|---|---|---|---|
| 3,652,275 A | 3/1972 | Baum et al. | |
| 4,162,162 A | 7/1979 | Dueber | |
| 2008/0113302 A1* | 5/2008 | Takashima | G03F 7/70275 430/322 |
| 2010/0028808 A1* | 2/2010 | Kubota | G03F 7/033 430/286.1 |
| 2010/0159691 A1* | 6/2010 | Tsutsui | G03F 7/031 438/758 |
| 2011/0262861 A1* | 10/2011 | Winkle | H01L 24/11 430/270.1 |
| 2016/0170299 A1* | 6/2016 | Kume | G03F 7/38 216/13 |
| 2016/0327861 A1* | 11/2016 | Foreman | G03F 7/033 |
| 2016/0330845 A1* | 11/2016 | Okade | C25D 7/00 |
| 2018/0237549 A1* | 8/2018 | Takeuchi | B32B 27/281 |
| 2018/0356723 A1* | 12/2018 | Jeon | C08F 283/105 |

FOREIGN PATENT DOCUMENTS

| | | | | |
|---|---|---|---|---|
| EP | 1701213 A2 * | 9/2006 | | G03F 7/031 |
| JP | 08-015520 A | 6/1994 | | |
| JP | 2009042720 A * | 2/2009 | | |
| JP | 2017-167394 A | 9/2017 | | |
| KR | 20120009607 A * | 2/2012 | | G03F 7/031 |
| WO | 2007/091560 A1 | 8/2007 | | |

OTHER PUBLICATIONS

Translated Description of Kaji (Year: 2009).*
Translated Application of Kim (Year: 2012).*

* cited by examiner

*Primary Examiner* — Jonathan Johnson
*Assistant Examiner* — Andrew Preston Traywick

(57) ABSTRACT

The present invention provides photosensitive compositions comprising: (a) a novel polymeric binder; (b) a polymerizable compound; (c) a photoinitiator; and (d) a photosensitizer. The photosensitive compositions having improved developing and/or stripping performance with comparable adhesion and resolution.

10 Claims, No Drawings

PHOTOSENSITIVE COMPOSITION AND PHOTORESIST DRY FILM MADE THEREFROM

FIELD OF THE INVENTION

The present invention relates to a photosensitive composition, a photosensitive dry film, and a method for forming a resist pattern derived from the photosensitive composition.

BACKGROUND OF THE INVENTION

In the fields of printed wiring boards (PCBs) and integrated circuits (ICs) fabrication, photosensitive compositions are well known to be used in the production of printed circuits, in the formation of lithographic printed plates, and in proofing applications. Regardless the various applications, the main function of the photosensitive compositions is to form a resist pattern. The general process in forming a resist pattern from a negative type photosensitive composition typically includes: i) applying a photosensitive composition onto a substrate, ii) imagewise exposing to active light rays, and iii) developing to form a resist pattern. After etching or plating treatment to form a pattern, the cured resist pattern is generally stripped from the processed substrate.

In association with the market trends of the electronic & communication products, the photosensitive composition are required to have excellent resolution and adhesiveness to meet the demands in increasing wiring/packing density. Furthermore, to improve the production efficiency, photosensitive compositions allow faster developing time as well as shortened stripping time are also needed.

Various photosensitive composition have been examined in the past to impart the desired properties in the photoresist made therefrom through altering at least one component of the photosensitive composition. For example, a photosensitive resin composition having improved chemical solution resistance and sensitivity is disclosed in by Japanese Patent Application No. 2017-167394, which teaches that the component (D), styryl-pyridine compound, enhances the photosensitizing property, and the component (A), a specific binder polymer derived from (meth)acrylic acid (I), styrene (II), alkyl (meth)acrylate (III), and an EO-modified phenol (meth)acrylate (IV), imparts the low swelling property.

To improve the resist pattern's developing time and stripping time may be achieved by increasing the acid content of the photosensitive composition that the resist pattern made therefrom. However, higher acid content of the photosensitive composition results in deteriorated adhesion and resolution.

There remains an ongoing need for new photosensitive compositions having improved developing and stripping properties, i.e. shorter developing time and stripping time, while maintaining good resolution and adhesiveness of the resulting resist pattern.

SUMMARY OF THE INVENTION

In a first aspect, the present invention relates to a photosensitive composition, comprising:
(a) a polymeric binder composed of 10-70% by weight of a structural unit represented by Formula 1,

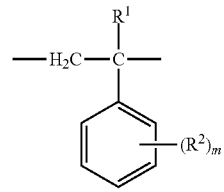

15-35% by weight of a structural unit represented by Formula 2, and

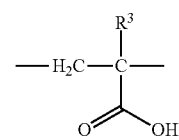

5-60% by weight of a structural unit represented by Formula 3,

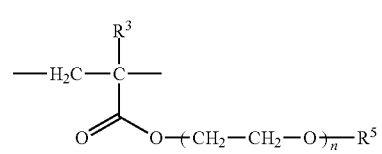

wherein
$R^1$, $R^3$, and $R^4$ each independently is H or $CH_3$;
$R^2$ is $C_1$-$C_3$ alkyl, $C_1$-$C_3$ alkoxy, —$NH_2$, or halogen;
m is an integer of 0-5, and when m is 2-5, the multiple $R^2$ groups may be the same or different;
$R^5$ is $C_1$-$C_3$ alkyl, benzyl, or $C(O)CH_2C(O)CH_3$; and
n is an integer of 0-12,
provided that when n is 0, then at least one divalent group of Formula 3, where n is other than 0 is present;
the weight ratio of each structural unit is based on the total weight of the polymerizable precursors for constituting the polymeric binder;
(b) a polymerizable compound;
(c) a photoinitiator; and
(d) a photosensitizer.

In a second aspect, the present invention relates to a photosensitive dry film comprising a support film and a photosensitive layer formed on the support film, wherein the photosensitive layer comprises the present photosensitive composition.

In a third aspect, the present invention relates to a method for forming a resist pattern on a substrate comprising:
i) forming an imageable layer comprising the photosensitive composition of the invention on a substrate;
ii) imagewise exposing to active light rays to produce exposed and non-exposed areas in the imageable layer, and
iii) developing the resist pattern by removing the unexposed sections of the imageable layer.

The foregoing general description and the following detailed description are exemplary and explanatory only and are not restrictive of the invention, as defined in the appended claims.

DETAILS OF THE INVENTION

All publications, patent applications, patents and other references mentioned herein, if not otherwise indicated, are explicitly incorporated by reference herein in their entirety for all purposes as if fully set forth.

Unless otherwise defined, all technical and scientific terms used herein have the same meaning as commonly understood by one of ordinary skill in the art to which this invention belongs. In case of conflict, the present specification, including definitions, will control.

Unless stated otherwise, all percentages, parts, ratios, etc., are by weight.

As used herein, the term "produced from" is synonymous to "comprising". As used herein, the terms "comprises," "comprising," "includes," "including," "has," "having," "contains" or "containing," or any other variation thereof, are intended to cover a non-exclusive inclusion. For example, a composition, process, method, article, or apparatus that comprises a list of elements is not necessarily limited to only those elements but may include other elements not expressly listed or inherent to such composition, process, method, article, or apparatus.

The transitional phrase "consisting of" excludes any element, step, or ingredient not specified. If in the claim, such a phrase would close the claim to the inclusion of materials other than those recited except for impurities ordinarily associated therewith. When the phrase "consisting of" appears in a clause of the body of a claim, rather than immediately following the preamble, it limits only the element set forth in that clause; other elements are not excluded from the claim as a whole.

The transitional phrase "consisting essentially of" is used to define a composition, method or apparatus that includes materials, steps, features, components, or elements, in addition to those literally discussed, provided that these additional materials, steps features, components, or elements do not materially affect the basic and novel characteristic(s) of the claimed invention. The term "consisting essentially of" occupies a middle ground between "comprising" and "consisting of".

The term "comprising" is intended to include embodiments encompassed by the terms "consisting essentially of" and "consisting of". Similarly, the term "consisting essentially of" is intended to include embodiments encompassed by the term "consisting of".

When an amount, concentration, or other value or parameter is given as either a range, preferred range or a list of upper preferable values and lower preferable values, this is to be understood as specifically disclosing all ranges formed from any pair of any upper range limit or preferred value and any lower range limit or preferred value, regardless of whether ranges are separately disclosed. For example, when a range of "1 to 5" is recited, the recited range should be construed as including ranges "1 to 4", "1 to 3", "1-2", "1-2 & 4-5", "1-3 & 5", and the like. Where a range of numerical values is recited herein, unless otherwise stated, the range is intended to include the endpoints thereof, and all integers and fractions within the range.

As used herein, the terms "a" and "an" include the concepts of "at least one" and "one or more than one". Unless stated otherwise, all percentages, parts, ratios, etc., are by weight.

When the term "about" is used in describing a value or an end-point of a range, the disclosure should be understood to include the specific value or end-point referred to.

Further, unless expressly stated to the contrary, "or" refers to an inclusive "or" and not to an exclusive "or". For example, a condition A "or" B is satisfied by any one of the following: A is true (or present) and B is false (or not present), A is false (or not present) and B is true (or present), and both A and B are true (or present).

The term "(meth)acrylic acid" means acrylic acid or methacrylic acid, the term "(meth)acrylate" means an acrylate or a corresponding thereto methacrylate. Similarly, the term "(meth)acryloyloxy group" means an acryloyloxy group or a methacryloyloxy group. The term "(poly)ethyleneoxy" means at least one of an ethyleneoxy group or a polyethyleneoxy group in which two or more ethylene groups are linked via an ether bond. The ethyleneoxy group is a group represented by ($-CH_2CH_2-O-$), and also referred to as "oxyethylene group" or "ethylene oxide." The term "(poly)propyleneoxy group" as used herein means at least one of a propyleneoxy group or a polypropyleneoxy group in which two or more propylene groups are linked via an ether bond. The propyleneoxy group is a group represented by ($-CHCH_3CH_2-O-$), a group represented by ($-CH_2CHCH_3-O-$), or a group represented by ($-CH_2CH_2CH_2-O-$), and also referred to as "oxypropylene group" or "propylene oxide." The term "EO-modified" compound means a compound having a (poly)ethyleneoxy group; "PO-modified" compound means a compound having a (poly)propyleneoxy group; and "EO, PO-modified" compound means a compound having both a (poly)ethyleneoxy group and a (poly)propyleneoxy group.

The terms "sheet", "layer" and "film" are used in their broad sense interchangeably.

Embodiments of the present invention include any embodiments described herein, may be combined in any manner, and the descriptions of variables in the embodiments pertain not only to the photosensitive compositions of the present invention, but also to the photosensitive dry films made therefrom.

The invention is described in detail herein under.

Photosensitive Composition

Hereinafter, each component which may be included in the photosensitive resin composition of the disclosure will be described.

(a) Polymeric Binder

The photosensitive composition comprises, as the component (a), a polymeric binder composed of a structural unit represented by Formula 1 (i.e. derived from a substituted styrene or α-methylstyrene), a structural unit represented by Formula 2 (i.e. derived from a (meth)acrylic acid), and at least one structural unit represented by Formula 3 (i.e. derived from a (meth)acrylate ester having a (poly)ethyleneoxy substituted group). The component (a) may, if necessary, further include other binders.

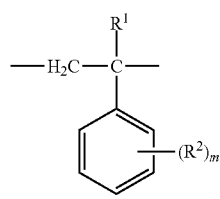

1

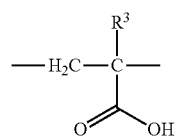

2

-continued

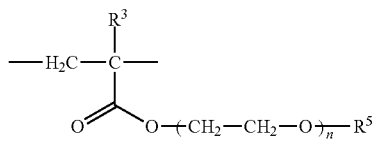

wherein
$R^1$, $R^3$, and $R^4$ each independently is H or $CH_2$;
$R^2$ is $C_1$-$C_3$ alkyl, $C_1$-$C_3$ alkoxy, —$NH_2$, or halogen;
m is an integer of 0-5, and when m is 2-5, the multiple $R^2$ groups may be the same or different;
$R^5$ is $C_1$-$C_5$ alkyl, benzyl, or $C(O)CH_2C(O)CH_3$; and
n is an integer of 0-12;
provided that when n is 0, then at least one divalent group of Formula 3, where n is other than 0 is present.

The weight ratio of a substituted styrene or α-methylstyrene (i.e. a precursor of the structural unit represented by Formula 1) is from 10-70% by weight, preferably from of 20-65% by weight, and more preferably from of 30-60% by weight, based on the total weight of the polymerizable precursors for constituting the polymeric binder (a).

The weight ratio of a (meth)acrylic acid (i.e. a precursor of the structural unit represented by Formula 2) is from 15-35% by weight, and preferably from of 20-30% by weight, based on the total weight of the polymerizable precursors for constituting the polymeric binder (a).

The weight ratio of a (meth)acrylate ester having a (poly)ethyleneoxy substituted group (i.e. a precursor of the structural unit represented by Formula 3) is from 5-60% by weight, preferably from of 10-55% by weight, and more preferably from of 15-50% by weight, based on the total weight of the polymerizable precursors for constituting the polymeric binder (a).

In one embodiment, the polymeric binder (a) is derived from a mixture composed of 10-70% by weight of a substituted styrene or α-methylstyrene, 15-35% by weight of a (meth)acrylic acid, and 5-60% by weight of a (meth)acrylate ester having a (poly)ethyleneoxy substituted group, based on the total weight of the polymerizable precursors for constituting the polymeric binder (a).

In another embodiment, the polymeric binder (a) is derived from a mixture composed of 20-65% by weight of a substituted styrene or α-methylstyrene, 20-30% by weight of a (meth)acrylic acid, and 10-55% by weight of a (meth)acrylate ester having a (poly)ethyleneoxy substituted group, based on the total weight of the polymerizable precursors for constituting the polymeric binder (a).

In yet another embodiment, the polymeric binder (a) is derived from a mixture composed of 30-60% by weight of a substituted styrene or α-methylstyrene, 20-30% by weight of a (meth)acrylic acid, and 15-50% by weight of a (meth)acrylate ester having a (poly)ethyleneoxy substituted group, based on the total weight of the polymerizable precursors for constituting the polymeric binder (a).

Note that the structural unit represented by Formula 3 may be derived from polymerizable precursors such as (meth)acrylate esters without a (poly)ethyleneoxy substituted group, provided that the polymerizable precursors constituting the polymeric binder include at least one (meth)acrylate ester having a (poly)ethyleneoxy substituted group. Examples of (meth)acrylate esters without a (poly)ethyleneoxy substituted group include alkyl (meth)acrylates, cycloalkyl (meth)acrylates, benzyl (meth)acrylate, or the like. The alkyl (meth)acrylate is preferably an alkyl (meth)acrylate that has an alkyl group having from 1 to 5 carbon atoms. Examples of alkyl (meth)acrylate include methyl (meth)acrylate, ethyl (meth)acrylate, propyl (meth)acrylate, butyl (meth)acrylate, pentyl (meth)acrylate, and mixtures thereof.

The weight ratio of a (meth)acrylate ester (i.e. a precursor of Formula 3, and n=0) is from 0-35% by weight, preferably from of 5-30% by weight, and more preferably from of 10-25% by weight, based on the total weight of the polymerizable precursors for constituting the polymeric binder (a).

In one embodiment, the polymeric binder (a) is derived from a mixture composed of 10-70% by weight of a substituted styrene or α-methylstyrene, 15-35% by weight of a (meth)acrylic acid, 5-60% by weight of a (meth)acrylate ester having a (poly)ethyleneoxy substituted group, and 0-35% by weight of a (meth)acrylate ester, based on the total weight of the polymerizable precursors for constituting the polymeric binder (a).

In another embodiment, the polymeric binder (a) is derived from a mixture composed of 20-65% by weight of a substituted styrene or α-methylstyrene, 20-30% by weight of a (meth)acrylic acid, 5-50% by weight of a (meth)acrylate ester having a (poly)ethyleneoxy substituted group, and 5-30% by weight of a (meth)acrylate ester, based on the total weight of the polymerizable precursors for constituting the polymeric binder (a).

In yet another embodiment, the polymeric binder (a) is derived from a mixture composed of 30-60% by weight of a substituted styrene or α-methylstyrene, 20-30% by weight of a (meth)acrylic acid, 5-40% by weight of a (meth)acrylate ester having a (poly)ethyleneoxy substituted group, and 10-25% by weight of a (meth)acrylate ester, based on the total weight of the polymerizable precursors for constituting the polymeric binder (a).

The polymeric binder (a) may be derived from other polymerizable precursors other than the above-described polymerizable precursors. Such other polymerizable precursors include but not limited to other (meth)acrylate esters such as furfuryl (meth)acrylate, tetrahydrofurfuryl (meth)acrylate, isobornyl (meth)acrylate, adamantyl (meth)acrylate, dicyclopentanyl (meth)acrylate, dimethylaminoethyl (meth)-acrylate, diethylaminoethyl (meth)acrylate, glycidyl (meth)acrylate, 2,2,2-trifluoro-ethyl (meth)acrylate, 2,2,3,3-tetra-fluoropropyl (meth)acrylate, dicyclopentenyl-oxyethyl (meth)acrylate, dicyclopentanyl-oxyethyl (meth)acrylate, isobonyloxyethyl (meth)acrylate, cyclohexyloxyethyl (meth)acrylate, adamantyloxyethyl (meth)acrylate, dicyclopentenyloxypropyloxyethyl (meth)-acrylate; (meth)acrylic acid derivatives such as α-bromoacrylic acid, α-chloroacrylic acid, β-furyl(meth)acrylic acid, and β-styryl(meth)acrylic acid; acrylamides such as diacetoneacrylamide; acrylonitrile; ether compounds of vinyl alcohol such as vinyl-n-butyl ether; maleic acid; maleic anhydride; maleic acid monoesters such as monomethyl maleate, monoethyl maleate, and monoisopropyl maleate; unsaturated carboxylic acid derivatives such as fumaric acid, cinnamic acid. α-cyanocinnamic acid, itaconic acid, crotonic acid, and propiolic acid; and mixtures thereof.

The polymeric binder (a) may be obtained, for example, by radical polymerization of a mixture composed of styrene or α-methyl styrene. (meth)acrylic acid, a (meth)acrylate ester having a (poly)ethyleneoxy substituted group, and optional other polymerizable precursors, using an ordinary method.

The weight-average molecular weight (Mw) of the polymeric binder measured by gel permeation chromatography (GPC) (calculated based on a calibration curve produced using polystyrene standards) is preferably from 25,000 to 100.000, more preferably from 30,000 to 70,000, and most preferably from 40,000 to 60,000.

The dispersity (weight average molecular weight/number average molecular weight, Mw/Mn) of the polymeric binder (a) is preferably 3.0 or less, more preferably 2.8 or less, and still more preferably 2.5 or less.

The acid value of the polymeric binder (a) is preferably from 90 mg KOH/g to 250 mg KOH/g, more preferably from 100 mg KOH/g to 240 mg KOH/g, and still more preferably from 120 mg KOH/g to 235 mg KOH/g.

The amount of the polymeric binder (a) in the present photosensitive composition is typically 30-70% by weight, preferably 35-65% by weight, and more preferably 40-60% by weight, based on the total weight of the photosensitive composition.

(b) Polymerizable Compound

The photosensitive composition comprises, as the component (b), a polymerizable compound that is capable of undergoing free-radical initiated polymerization and/or crosslinking. Such compounds are well known in the art and may be referred to as "monomers" hereunder.

Suitable monomers which may be used as the sole monomer or in combination with others include the following: t-butyl (meth)acrylate, cyclohexyl (meth)acrylate, hydroxy-$C_1$-$C_{10}$-alkyl (meth)acrylate; ethylene glycol di(meth)acrylate, butanediol di(meth)acrylate, hexamethylene glycol di(meth)acrylate, diethylene glycol di(meth)acrylate, 1,4-cyclo-hexanediol di(meth)acrylate, 2,2-dimethylolpropane di(meth)acrylate, polyethylene glycol di(meth)acrylate, polypropylene glycol di(meth)acrylate. EO-modified polypropylene glycol di(meth)acrylate, trimethylolpropane di(meth)acrylate, glycerol di(meth)acrylate; glycerol tri (meth)acrylate, trimethylolpropane tri(meth)acrylate, EO-modified trimethylolpropane tri(meth)acrylate, PO-modified trimethylolpropane tri(meth)acrylate, EO-PO-modified trimethylolpropane tri(meth)acrylate, pentaaerythritol tri (meth)acrylate, and pentaaerythritol tetra(meth)acrylate; (meth)acryloxyalkyl ethers of bisphenol A such as 2,2-bis (4-((meth)-acryloxypolyethoxy)phenyl) propane, 2,2-bis(4-((meth)acryloxypolypropoxy)phenyl) propane, 2,2-bis(4-((meth)acryloxypolybutoxy)phenyl) propane, and 2,2-bis(4-((meth)acryloxy-polyethoxypolypropoxy)phenyl) propane; unsaturated amides such as 1,6-hexamethylene bisacrylamide; vinyl esters such as divinyl succinate, divinyl phthalate, and divinyl benzene-1,3-disulfonate; styrene and derivatives thereof; and N-vinyl compounds such as N-vinyl carbazole.

Preferred polymerizable compounds include polyethoxylated trimethylolpropane tri(meth)acrylate, trimethylolpropane tri(meth)acrylate, triethylene glycol di(meth)acrylate, polyethoxylated bisphenol A di(meth)acrylate, polypropoxylated propylene glycol mono(meth)acrylate, and polypropoxylated propylene glycol di(meth)acrylate, and mixtures thereof.

Examples of commercially available polymerizable compounds include 2,2-bis(4-(methacryloxydiethoxy)phenyl) propane (e.g., "FA-324M" manufactured by Hitachi Chemical Co., Ltd.), 2,2-bis(4-(methacryloxy-polyethoxypolypropoxy)phenyl) propane (an adduct of 12 mol in average of ethyleneoxy groups and 4 mol in average of propyleneoxy groups) (e.g., "FA-3200MY" manufactured by Hitachi Chemical Co., Ltd.), tetramethylolmethane triacrylate (e.g., "A-TMM-3" manufactured by Shin-Nakamura Chemical Co., Ltd.), EO-modified trimethylolpropane trimethacrylate (e.g., "TMPT21E", "TMPT30E" manufactured by Hitachi Chemical Co., Ltd), pentaerythritol triacrylate (e.g., "SR444" manufactured by Sartomer), dipentaerythritol hexaacrylate (e.g., "A-DPH" manufactured by Shin-Nakamura Chemical Co., Ltd.), and ethoxylated pentaerythritol tetraacrylate (e.g., "ATM-35E" manufactured by Shin-Nakamura Chemical Co., Ltd). These compounds may be used alone or in combinations of two or more different ones.

The amount of the pol polymerizable compounds (b) in the present photosensitive composition is typically 10-70% by weight, preferably 20-60% by weight, and more preferably 30-50% by weight, based on the total weight of the photosensitive composition.

(c) Photoinitiator

The photosensitive composition comprises, as the component (c), a photoinitiator. The photoinitiator (c) is not particularly limited, and appropriately selected from conventionally employed photoinitiators.

Examples of the photoinitiators include aromatic ketones such as benzophenone, bis-4,4'-dimethylaminobenzo-phenone (Michler's ketone), bis-4,4'-diethyl-aminobenzo-phenone (ethyl Michler's ketone), 2-benzyl-2-dimethylamino-1-(4-morpholino-phenyl)-1-butanone, and 2-methyl-1-[4-(methylthio)phenyl]-2-morpholino-1-propanone; quinones such as 9,10-anthroquinones, 1,4-naphthquinones, and phenanthrene quinones; benzoin ether compounds such as a benzoin alkyl ethers; benzoin compounds such as benzoin and alkyl benzoins; benzyl derivatives such as benzyl dimethyl ketal; hexaarylbiimidazole compounds, abbreviated as "HABI", such as 2,2',-bis(o-chloro-phenyl)-4,4',5,5'-tetraphenyl-1,1'-biimidazole (o-Cl-HABI), 2,2',5-tris(o-chlorophenyl)-4-(3,4-di-methoxyphenyl)-4',5'-diphenyl-1,1'-biimidazole (TCDM-HABI), 2,2'4,4'-tetra(o-chlorophenyl)-5,5'-bis(3,4-dimethoxyphenyl)-1,1'-biimidazole (TCTM-HABI); 2,2'-bis(o-chloro-phenyl)-4,4',5,5'-tetra(m-methoxyphenyl)-1,1'-biimidazole (CDM-HABI), and 2,2'-bis(2-ethoxyphenyl)-4,4',5,5'-tetraphenyl-1,1'-biimidazole (OE-HABI); and acridine derivatives such as 9-phenylacridine and 1,7-(9,9'-acridinyl)heptane; and mixtures thereof. Preferred photoinitiator includes at least one hexaarylbiimidazole compound, and more preferably o-Cl-HABI, TCDM-HABI, and a mixture thereof.

Suitable photoinitiators are commercially available, for example, o-Cl-HABI and TCDM-HABI may be purchased from Hampford Research Inc.

The amount of the photoinitiator (c) in the present photosensitive composition is typically 0.1-20% by weight, preferably 0.5-10% by weight, and more preferably 1-5% by weight, based on the total weight of the photosensitive composition. These may also be used alone or in combinations of two or more.

(d) Photosensitizer

The photosensitive composition comprises, as the component (d), a photosensitizer. Since the preferred photoinitiator (c) being a HABI compound, it generally has a maximum absorption in the 255-275 nm region of the spectrum with additional absorption in the 300-375 nm region. Photosensitizer may be added to extend the spectral response and preferably with a local maximum absorption wavelength of from 340 nm to 420 nm.

Examples of the photosensitizers include pyrazolines, anthracenes, coumarins, xanthones, oxazoles, benzoxazoles, thiazoles, benzothiazoles, triazoles, stilbenes, triazines, thiophenes, naphthalimide compounds, bis(p-dialkylaminobenzylidene) ketone s disclosed in U.S. Pat. No. 652,275, and arylidene aryl ketones disclosed in U.S. Pat. No. 4,162,162.

A preferred group of sensitizers include 1,3-bis(1,3-dihydro-1,3,3-trimethyl-2H-indol-2-ylidene)-2-propanone (Bis-Fischer's Base Ketone), 2,3,6,7-tetra-hydro-9-methyl- 1H,5H, 11H-[1]benzopyrano[6,7,8-ij]quinolizin-11-one (Coumarin 480), and 9,10-dibutoxy-anthracene.

Suitable photosensitizers are commercially available, for example, Bis-Fischer's Base Ketone ("BFBK") may be purchased from Hampford Research Inc.

The amount of the photosensitizer (d) in the present photosensitive composition is typically 0.01-10% by weight, and preferably 0.05-5% by weight, on the total weight of the photosensitive composition.

(e) Hydrogen Donor

The photosensitive composition preferably comprises a hydrogen donor, as the component (e), capable of donating hydrogen to the photoinitiator (c) and to improve the contrast between an exposed area and an unexposed area of the photosensitive composition after exposing to active light rays.

Examples of the hydrogen donors include bis(4-(dimethylamino)phenyl)methane, bis(4-(diethylamino)phenyl) methane, tris(4-(diethylamino)phenyl)methane (a.k.a. Leuco Crystal Violet), N-phenylglycine, tribromomethyl phenyl sulfone, 1-dodemayethiol, 4-methyl-4H-1,2,4-triazole-3-thiol, 2-mercaptobenzothiazole, 5-chloro-2-mercapto-benzo-thiazole, 6-ethoxy-2-mercaptobenzo-thiazole, and mixtures thereof.

The amount of the hydrogen donor (e) in the present photosensitive composition is typically 0.05-2% by weight, and preferably 0.1-1% by weight, based on the total weight of the photosensitive composition.

(f) Other Additives

Other compounds conventionally added to photosensitive compositions may also be present. Such additives include: adhesion modifiers, antioxidants, coating aids, dyes such as N,N,N',N'-tetramethyl-4,4'-diamino-triphenylcarbenium chloride (Malachite Green), defoaming agents, leveling agent, plasticizers such as p-toluenesulfonamide, pigments, release agents, surfactants, stabilizing agents, viscosity control agents, wetting agents, and the like.

An adhesion modifier may be added to improve adhesion of the coating to copper-clad substrates and or prevent residue formation during processing. Suitable adhesion modifiers include heterocyclic chelating components such as benzotriazole, 5-chlorobenzotriazole, 1-chlorobenzotriazole, 4- and 5-carboxybenzotriazole, 1-hydroxybenzotriazole, 2-mercapto-benzoxazole, 1H-1,2,4-triazole-3-thiol, 5-amino-1,3,4-thiodiazole-2-thiol, and mercapto-benzimidazole. Citric acid is an example of a non-heterocyclic chelating compound that is effective in this manner, i.e. to improve adhesion of the coating and or prevent residue formation.

A surfactant may be added to improve coating properties of the photosensitive composition. Examples of surfactants include polyoxyethylene octylphenyl ether, polyoxy ethylene nonyl phenylether, F171, F172, and F173 (available from Dainippon Ink & Chemicals, Japan), FC430 and FC431 (available from Sumitomo 3M Ltd., Japan), KP341 (available from Shinetsu Chemical Co., Japan), among others.

The other additives (f) are generally present in minor amounts (i.e. less than 10% by weight) so as not to interfere with the functional properties of the present photosensitive composition.

The present photosensitive composition, based on the total weight of the photosensitive composition, typically comprises:
(a) 30-70% by weight of at least one polymeric binder;
(b) 10-70% by weight of at least one polymerizable compound.
(c) 0.1-20% by weight of at least one photoinitiator,
(d) 0.01-1% by weight of at least one photosensitizer;
(e) 0-2% by weight of at least one hydrogen donor; and
(f) 0-10% by weight of other additives.

In one embodiment, the present photosensitive composition, based on the total weight of the photosensitive composition, comprises:
(a) 35-65% by weight of at least one polymeric binder;
(b) 20-60% by weight of at least one polymerizable compound;
(c) 0.5-10% by w eight of at least one photoinitiator;
(d) 0.01-1% by w eight of at least one photosensitizer;
(e) 0.05-2% by weight of at least one hydrogen donor; and
(f) 0-5% by weight of other additives.

In another embodiment, the present photosensitive composition, based on the total weight of the photosensitive composition, comprises:
(a) 40-60% by weight of at least one polymeric binder;
(b) 30-50% by weight of at least one polymerizable compound;
(c) 1-5% by weight of at least one photoinitiator;
(d) 0.05-0.5% by weight of at least one photosensitizer;
(e) 0.1-1% by weight of at least one hydrogen donor; and
(f) 0.01-5% by weight of other additives.

Photosensitive Dry Film

The photosensitive dry film of the present invention comprises: a support film and a photosensitive layer formed on the support film, wherein the photosensitive layer comprises the present photosensitive composition. The photosensitive composition in the photosensitive layer is in an uncured state and then covered with a protective film when it is stored in a roll form. The photosensitive dry film may be referred as "photoresist", "dry film" or "dry film photoresist", interchangeably.

The support film is polymeric film preferably having a high dimensional stability with a transmittance of >90%, with respect to ultraviolet light rays having a wavelength of from 350 nm to 420 nm, and may be composed of polyamides, polyolefins, polyesters, vinyl polymers, and cellulose esters. A particularly suitable support film is a film composed of polyethylene terephthalate, polyethylene, or polypropylene. The thickness of the support film is from 1 μm to 100 μm, preferably from 5 μm to 50 μm, and more preferably from 10 μm to 30 μm.

The cover sheet may be selected from the same group of polymeric films described for the support film, supra, and may have the same wide range of thicknesses; however, it is preferable to use a cover sheet that has lower adhesion to the photosensitive layer relative to the adhesion of the photosensitive layer to the support film. A particularly suitable cover sheet is a film composed of polyethylene, polypropylene, or polyethylene terephthalate.

Examples of commercially available products thereof include: polyethylene terephthalate films of PS series manufactured by Teijin Limited, and FB series manufactured by Toray Industries, Inc.; polyethylene films such as ALPHAN MA-410 and E-200 manufactured by Oji Paper Co., Ltd.; and a polypropylene film manufactured by Shin-Etsu Film Co., Ltd.

When the present photosensitive composition is in liquid form with suitable viscosity, it may be applied onto the support film directly to form the photosensitive layer. Preferably, the present photosensitive composition is dissolved in an organic solvent to lower the viscosity and allow forming the photosensitive layer with an uniform thickness.

Examples of suitable solvents include alcohols such as methanol, ethanol, propanol, butanol and the like; ethers such as tetrahydrofuran; ketones such as acetone and methyl ethyl ketone; glycol ethers such as methylcellosolve, ethylcellosolve, and propyleneglycol monomethyl ether; aromatic hydrocarbon solvents such as toluene; aprotic polar solvents such as N,N-dimethylformamide; and mixtures thereof. The solvents may be appropriately selected depending on the solubility of the photosensitive composition.

In one embodiment, the photosensitive dry film may be manufactured by i) forming a photosensitive layer by applying a coating solution containing the present photosensitive composition to a support film; and ii) drying the resultant to form the photosensitive layer.

The solid content of the coating solution containing the photosensitive composition may be appropriately selected depending on the application method and tool. For example, the organic solvent may be used to give a solution with a solid content of from about 15% by weight to about 60% by weight.

The coating solution may be applied to the support film by a known method such as roll coating, comma coating, gravure coating, air knife coating, die coating, or bar coating.

The drying is preferably carried out at from 25° C. to 120° C. for about 5 minutes to about 60 minutes. The amount of the residual solvent in the photosensitive layer after drying is preferably 2% by weight or less.

The thickness of the photosensitive layer may be appropriately selected depending on the intended use. The post-drying thickness is from 1 μm to 350 μm, preferably from 5 μm to 100 μm, and more preferably from 10 μm to 50 μm.

The shape of the resulting photosensitive dry film is not particularly limited. The photosensitive dry film may be a sheet form, or may be wound into a roll shape around a core. When the photosensitive dry film is wound into a roll shape, it is preferable that the support film faces outside.

The photosensitive dry film according to the present embodiment may be used, for example, in the method for forming a resist pattern as described below.

Method for Forming Resist Pattern

The photosensitive composition of the invention may be used to form a resist pattern. The method for forming a resist pattern on a substrate, comprising:
 i) forming an imageable layer comprising the photosensitive composition of the invention on a substrate;
 ii) imagewise exposing to active light rays to produce exposed areas and unexposed areas in the imageable layer; and
 iii) developing the resist pattern by removing the unexposed sections of the imageable layer.

The first step in the method of the invention is: i) forming an imageable layer comprising the photosensitive composition of the invention on a substrate. The imageable layer may be referred as "photoresist" or "resist" hereunder.

A wide variety of substrates may be used in the present method. By "substrate" is meant any natural or synthetic support, preferably one which is capable of existing in a flexible or rigid form. For example, the substrate may be a metal sheet or foil, a sheet or film of synthetic polymer, cellulose paper, fiberboard, and the like, or a composite of two or more of these materials. The substrate used here may be a substrate for forming circuits provided with an insulating layer and a conductor layer formed on the insulating layer.

The particular substrate will generally be determined by the intended application. For example, when printed circuit boards are produced, the substrate may be a copper coated fiberglass epoxy board, copper clad film, or printed circuit relief pattern on the board or film. The type of printed circuit boards manufactured may be single sided, double sided, or of multiple layers. For lithographic printing plates, the substrate may be anodized aluminum. For semiconductor packages are produced, the substrate may be a copper coated fiberglass epoxy board or seed layer on built up layer. For bumps are produced, the substrate may be seed layer on silicon, glass carriers, or molding carriers.

To form an imageable layer comprising the present photosensitive composition on a substrate may be done by coating the photosensitive composition in a suitable solvent as described previously. Alternatively, the imageable layer may be formed by laminating the present photosensitive dry film on a substrate. If a cover sheet is present in the photosensitive dry film, it is first removed and the uncovered surface of the photosensitive layer is laminated to the pre-cleaned surface of the substrate using heat and/or pressure, e.g., with a conventional hot-roll laminator. The laminating parameters including temperature, pressure, and duration may be appropriately selected as needed by one skilled in the art.

The support film acts as a protective sheet and the laminate may be exposed to active light rays through the support film. In some instances, the support film may be removed before irradiating to improve resolution and other such properties.

The second step in the method of the invention is: ii) imagewise exposing to active light rays to produce exposed and non-exposed areas in the imageable layer.

Examples of the exposure method include a method of irradiating active light rays imagewise through a negative or positive pattern (i.e. a photomask), which is referred to as a mask exposure method. Alternatively, a method for irradiating active light rays imagewise by a direct writing exposure method such as LDI (Laser Direct Imaging) exposure method or DLP (Digital Light Processing) exposure method may be used.

Any convenient source or sources of active light rays providing wavelengths in the region of the spectrum that overlap the absorption bands of the photoinitiator and/or photosensitizer can be used to activate the photopolymerization reactions. Conventional light sources include gas lasers such as a carbon arc lamp, a mercury vapor arc lamp, an ultra-high-pressure mercury lamp, a xenon lamp, or an argon laser; solid lasers such as a YAG laser; semiconductor lasers, ultraviolet rays such as a gallium nitride-based violet laser; and a lamp that efficiently emits visible light.

The third step in the process of the invention is: iii) developing the resist pattern by removing the unexposed sections of the imageable layer.

When the support film remains on the imageable layer, the support film is removed and then the unexposed area is removed (developed). Examples of the development process include wet development and dry development, and the wet development is widely used.

The developing solution (i.e. developer) is generally an aqueous solution of from 0.01% by weight to 5% by weight of a water-soluble base. Suitable bases include the alkali metal hydroxides such as lithium, sodium and potassium hydroxide; the base-reacting alkali metal salts of weak acids such as lithium, sodium and potassium carbonates and bicarbonates; ammonium hydroxide and tetra-substituted ammonium hydroxides such as tetramethyl and tetraphenyl ammonium hydroxide; sulfonium salts including the hydroxides, carbonates, bicarbonates, and sulfides; alkali metal phosphates and pyrophosphates such as sodium and potassium triphosphates and pyrophosphates; tetra-substituted phosphonium arsonium and stibonium hydroxides such as tetramethylphosphonium hydroxide. A preferred developer is a 0.1-3% by weight of sodium carbonate aqueous solution.

The developer may also contain surfactants. However, the total organic content should be less than 10% by weight, preferably less than 5% by weight.

The resist pattern development can be carried out as a batch or a continuous process using any conventional technique, such as dipping or spraying. The development can be conducted at room temperature or heated to a temperature up to about 50° C. Many commercial processors are available for development.

Application of Resist Pattern Formed Substrates

The resist pattern formed substrate may be subjected to further processing steps for the intended applications, including: printed circuit board productions, semiconductor package productions, and bump productions.

For example, the method for producing a printed wiring board comprising: etching or plating a substrate (substrate for forming circuits), which has an insulating layer and a conductor layer formed on the insulating layer and in which the resist pattern has been formed on the conductor layer, by the method for forming a resist pattern to form a conductor pattern.

The etching method may be appropriately selected depending on components of the conductor layer to be removed. Examples of etching solutions include a cupric chloride solution, a ferric chloride solution, an alkali etching solution, and a hydrogen peroxide etching solution. Among these, it is preferable to use the ferric chloride solution in view of sufficient etch factor.

Examples of the plating include copper plating such as copper sulfate plating or copper pyrophosphate plating; solder plating such as high throwing solder plating; nickel plating such as Walt bath (nickel sulfate-nickel chloride) plating or nickel sulfaminate plating; and gold plating such as hard gold plating or soft gold plating. After plating, the resist pattern is removed, and then the conductor layer that has been covered with the resist pattern is subjected to etching, thereby forming the conductor pattern.

In one embodiment, the present invention relates to a method for producing a printed wiring board comprising: etching or plating a substrate having a resist pattern formed according to the present method to form a conductor pattern.

In yet another embodiment, the present invention relates to a method for producing a semiconductor package comprising: plating the substrate having a resist pattern formed according to the present method.

In a further embodiment, the present invention relates to a method for producing a bump comprising: plating the substrate having a resist pattern formed according to the present method.

Once the resist pattern has performed its function, the resist pattern may be then removed from the substrate generally by an aqueous stripping solution (i.e. stripper), which may contain organic amines or solvents to improve strip speed or to minimize metal attack or staining. The aqueous stripping solution typically has stronger alkalinity than that of the aqueous developing solution used in developing the resist pattern. The aqueous stripping solution may be an aqueous solution of 1-10% by weight of sodium hydroxide or potassium hydroxide.

Examples of the resist pattern removal methods include dipping and spraying, and these methods are used singly or in combination thereof.

Without further elaboration, it is believed that one skilled in the art using the preceding description may utilize the present invention to its fullest extent. The following examples are, therefore, to be construed as merely illustrative, and not limiting of the disclosure in any way whatsoever.

EXAMPLES

The abbreviation "E" stands for "Example" and "CE" stands for "Comparative Example" is followed by a number indicating in which example the copper clad laminate (FR4) is prepared. The examples and comparative examples were all prepared and tested in a similar manner.

Materials (A) Starting Materials Used for Polymeric Binder Preparation

S-1: Styrene, CAS #100-42-5, purchased from Formosa Plastics Corporation.
S-2: Methacrylic acid, MAA, CAS #79-41-4, purchased from Mitsubishi Chemical Corporation.
S-3a: 2-(Acetoacetoxy)ethyl methacrylate, CAS #21282-97-3, Mw: 214.22, purchased from Sigma-Aldrich.
S-3b: Ethylene glycol methyl ether acrylate, CAS #3121-61-7, Mw: 130.14, purchased from Sigma-Aldrich.
S-3c: Ethylene glycol methyl ether methacrylate, CAS #6976-93-8, Mw: 144.17, purchased from Sigma-Aldrich.
S-3d: Di(ethylene glycol) methyl ether methacrylate, CAS #45103-58-0, Mw: 188.22, purchased from Sigma-Aldrich.
S-3e: Phenoxyethyl acrylate, CAS #48145-04-6, Mw: 192.21, trade name SR339 from Sartomer-Arkema.
S-3f: Methyl methacrylate, MMA, CAS #80-62-6, purchased from Mitsubishi Chemical Corporation.
S-3g: Benzyl methacrylate. BzMA. CAS #2495-37-6, purchased from Mitsubishi Chemical Corporation.

Synthesis Example 1: Preparing the Polymeric Binder (A-1)

A mixture of 48 g of methacrylic acid, 38.4 g of methyl methacrylate, 105.6 g of styrene and 1.49 g of azobisisobutyronitrile (AIBN) was added dropwise into a 2 L flask containing a solvent system (150 g) composed of 1-methoxy-2-propanol and toluene in a weight ratio of 6:4 at 95° C. After addition completed, the reaction mixture was stirring at 95° C. for 1.5 hours. A solution of 4.8 g of AIBN in 6.4 g of a solvent system (1-methoxy-2-propanol:toluene=6:4) was added to the reaction mixture, then heated with stirring to 100° C. for 2 hours, and then cooled room temperature to obtain a polymeric binder solution (A-1), which is derived from a mixture composed of 58% of styrene, 21% of methacrylic acid, and 21% of methyl methacrylate; and is represented herein as St/MAA/MMA (55/25/20). The $M_w$ of the polymeric binder solution (A-1) was 48000.

Synthetic Examples 2-13: Preparing the Polymeric Binder (A-2)-(A-16)

Solution of each polymeric binder (A-2) to (A-16) was obtained according to the same procedures described in Synthesis Example 1 for the solution of the polymeric binder (A-1), except that materials were used to constitute the respective polymeric binder and in amounts shown in Table 1, the compounds for forming the structural unit of Formula 3 are shown in Table 2.

TABLE 1

| Binder | S-1 | S-2 | S-3a | S-3b | S-3c | S-3d | S-3e | S-3f | S-3g | Ave. $M_w$ (Da) |
|---|---|---|---|---|---|---|---|---|---|---|
| A-1 | 55 | 25 | | | | | | 20 | | 48000 |
| A-2 | 55 | 25 | | | | | | | 20 | 45000 |
| A-3 | 55 | 25 | 20 | | | | | | | 49000 |
| A-4 | 55 | 25 | 15 | | | | | 5 | | 47000 |
| A-5 | 55 | 25 | 10 | | | | | | 10 | 46000 |
| A-6 | 55 | 25 | | 20 | | | | | | 40000 |
| A-7 | 55 | 25 | | | 20 | | | | | 41000 |
| A-8 | 50 | 25 | | | 25 | | | | | 43000 |
| A-9 | 55 | 25 | | | | 20 | | | | 49000 |
| A-10 | 20 | 25 | | | | | | 55 | | 45000 |
| A-11 | 20 | 25 | | 25 | | | | 30 | | 45000 |
| A-12 | 20 | 25 | | | | | | | 55 | 49000 |
| A-13 | 20 | 25 | | 25 | | | | | 30 | 43000 |
| A-14 | 35 | 30 | | | | | | | 35 | 45000 |
| A-15 | 35 | 30 | | | | 20 | | | 15 | 46000 |
| A-16 | 35 | 30 | | | | | 35 | | | 52000 |

TABLE 2

$$-H_2C-\underset{\underset{O-(CH_2-CH_2-O)_n-R^5}{\overset{\|}{C}}}{\overset{R^4}{\underset{}{C}}}-$$

3

| | |
|---|---|
| S-3a | $n = 1, R^4 = CH_3, R^5 = C(O)CH_2C(O)CH_3$ |
| S-3b | $n = 1, R^4 = H, R^5 = CH_3$ |
| S-3c | $n = 1, R^4 = CH_3, R^5 = CH_3$ |
| S-3d | $n = 2, R^4 = CH_3, R^5 = CH_3$ |
| S-3e | $n = 1, R^4 = H, R^5 = $ phenyl |
| S-3f | $n = 0, R^4 = CH_3, R^5 = CH_3$ |
| S-3g | $n = 0, R^4 = CH_3, R^5 = $ benzyl |

Weight average molecular weight ($M_w$) Determination

The weight-average molecular weight ($M_w$: in terms of polystyrene) and $M_n$ were determined by GPC (carrier: tetrahydrofuran), and the unit was Da.

The GPC conditions were as follows:

Pump: Agilent 1200 LC system.

Column: Mz-Gel SDplus™ LS-Linear precolumn, Mz-Gel SDplus™ LS-Linear, Mz-Gel SDplus™ LS-1000A, Mz-Gel SDplus™ LS-O000A (all trade name of MZ-Analysentechnik GmbH).

Fluent: tetrahydrofuran

Measuring temperature; 40° C.

Flow rate: 0.75 mL/min

Detector; Waters 410 Differential Refractive Index Detector.

(B) Polymerizable Compound

B-1: ethoxylated-3-trimethylolpropane triacrylate, CAS #28961-43-5, purchased from Sartomer-Arkema, trade name: SR454NS.

B-2: 2,2-bis(4-methacryloxypolyethoxyphenyl)propane, CAS #41637-38-1, purchased from Sartomer-Arkema, trade name: SR480NS.

(C) Photoinitiator

C-1: 2-(2-chlorophenyl)-1-[2-(2-chlorophenyl)-4,5-diphenyl-2H-imidazol-2-yl]-4,5-diphenyl-1H-imidazole, o-Cl-HABI, CAS #7189-82-4, Mw:659.60, purchased from Hampford Research Inc.

(D) Photosensitizer

D-1: 1,3-bis(1,3,3-trimethyl-2-indolinylidene)-2-propanone (bis-Fisher's base ketone), CAS #24293-934, abbreviated as "BFBK", manufactured by Hampford Research Inc.

(E) Hydrogen Donor

E-1: Leuco Crystal Violet, CAS #603-48-5, abbreviated as "LCV", manufactured by Tronly.

(F) Other Additives

F-1: 5-carboxy-1H-benzotriazole, CBT, CAS #60932-58-3, Mw: 163.13, purchased from PMC Specialties Group, USA.

F-2: 5-chloro-1H-benzotriazole, 5-Cl-BT, CAS #94-97-3, Mw: 153.57, purchased from Sigma-Aldrich.

F-3: Malachite Green, chloride salt, CAS #569-64-2, purchased from Sigma-Aldrich.

Step A. Preparation of Photoresist Dry Films

The photoresist dry film of each Example or comparative Example was prepared from a coating solution having a solid content of 27% in a mixed solvent of acetone/methanol (90:10 w/w). The coating solution was made by mixing and dissolving the ingredients with the weight ratio listed in Tables 3 and 4.

The coating solution was then casted onto a support film, i.e. a polyethylene terephthalate (PET) film with a thickness of 19 μm, and allowed to dry at room temperature to provide a photoresist dry film (i.e. the photosensitive dry film) having a thickness of 25 μm.

Step B. Preparation of Laminates Containing the Photoresist Dry Films

A copper substrate (size: 27 cm (W)×35 cm (L)×1 mm (H)) was first scrubbed by a #2000-equivalent brush and cleaned with an acid (5% $H_2SO_4$). Each dried photoresist dry film was laminated to the cleaned copper substrate using a HRL-24 laminator (DuPont Co., Wilmington, Del.). The lamination was performed at 120° C. and a speed of 2 m/min with a pressure of 5 kg/cm². After lamination, each sample was allowed to cool to room temperature for 1 hour to obtain a laminate containing a specific photosensitive composition with a construction of [PET/photoresist/Cu].

Evaluation of Developing Time

A specimen (size: 27 cm×10 cm) for the developing time evaluation was cut from each laminate of the Examples and Comparative Examples that was prepared according to step A as described above.

After removing the PET film, the specimen was placed in a conveyorized developer and sprayed with a sodium carbonate solution (1 weight % in water) at 30° C. The developing time of the specimen was visually determined by the minimum time needed to completely removing the photoresist from the copper substrate and recorded in Tables 3 and 4.

Evaluation of Adhesion

A specimen (size: 27×7 cm²) for the adhesion evaluation was cut from each laminate of the Examples and Comparative Examples that was prepared according to the step described above.

The exposure of each specimen was conducted by using a IP-8 laser direct imager (manufactured by ADTEC Engineering Co., Ltd) with a photomask. The photomask contains wiring patterns having a line width (L)/space width (S) (referred to as "L/S" hereunder) ranging from 5/15 to 30/90 (units: μm). A 25-step density step wedge was then placed on top of the PET film and the exposure step was conducted for exposure at 405 nm. The exposure energy dose was set to obtain 7 steps remaining on the 25-step wedge.

Following the exposure, the support film (i.e. a PET film) was removed. The specimen was developed by placing in the same conveyorized developer as mention above, and sprayed with a sodium carbonate solution (1 weight % in water) at 30° C. for a duration that was twice the developing time. After rinsing with deionized water and drying, the adhesion was represented by the smallest value of the line remained on the Cu substrate without breaking and twistiness. Therefore, a smaller value means better adhesion. The results are shown in Tables 3 and 4.

Evaluation of Resolution

A specimen (size: 27 cm×7 cm) for the resolution evaluation was cut from each laminate of the Examples and Comparative Examples that was prepared according to the step described above.

The exposure of each specimen was conducted by using a IP-8 laser direct imager (manufactured by ADTEC Engineering Co., Ltd) with a photomask. The photomask contains wiring patterns having a US ranging from 5/5 to 30/30 (units: μm). A 25-step density step wedge was then placed on top of the PET film and the exposure step was conducted for exposure at 405 nm. The exposure energy dose was set to obtain 7 steps remaining on the 25-step wedge.

Following the exposure, the support film (i.e. a PET film) was removed. The specimen was developed by placing in the same conveyorized developer as mention above, and sprayed with a sodium carbonate solution (1 weight % in water) at 30° C. for a duration that was twice the developing time. After rinsing with deionized water and drying, the resolution was the smallest value of the space width between the exposed lines where the unexposed section was removed cleanly. Therefore, a smaller value means better resolution. The results are shown in Tables 3 and 4.

Evaluation of Stripping Time

A specimen (size: 5 cm×5 cm) for the stripping time evaluation was cut from each laminate of the Examples and Comparative Examples that was prepared according to the step described above.

The exposure of each specimen was conducted by using a IP-8 laser direct imager (manufactured by ADTEC Engineering Co., Ltd) without any photomask. A 25-step density step wedge was then placed on top of the PET film and the exposure step was conducted for exposure at 405 nm. The exposure energy dose was set to obtain 9 steps remaining on the 25-step wedge.

Following the exposure, the support film (i.e. a PET film) was removed. The specimen was developed by placing in the same conveyorized developer as mention above, and sprayed with an sodium carbonate solution (1 weight % in water) at 30° C. for a duration that was twice the developing time. The specimen was obtained after rinsing with deionized water and drying.

The stripping test was conducted by dipping the fully developed specimen into 1 L of a sodium hydroxide solution (3 weight % in water) at 50° C. until the photoresist was completely removed. The stripping time was evaluated as the time for completely removing cured photoresist. The results are shown in Tables 3 and 4.

TABLE 3

| Ingredient | CE1 | CE2 | E1 | E2 | E3 | E4 | E5 | E6 | E7 |
|---|---|---|---|---|---|---|---|---|---|
| A-1: St/MAA/MMA (55/25/20) | 54 | | | | | | | | |
| A-2: St/MAA/BzMA (55/25/20) | | 54 | | | | | | | |
| A-3: St/MAA/S-3a (55/25/20) | | | 54 | | | | | | |
| A-4: St/MAA/S-3a/MMA (55/25/15/5) | | | | 54 | | | | | |
| A-5: St/MAA/S-3a/BzMA (55/25/10/10) | | | | | 54 | | | | |
| A-6: St/MAA/S-3b (55/25/20) | | | | | | 54 | | | |
| A-7: St/MAA/S-3c (55/25/20) | | | | | | | 54 | | |
| A-8: St/MAA/S-3c (50/25/25) | | | | | | | | 54 | |
| A-9: St/MAA/S-3d (55/25/35) | | | | | | | | | 54 |
| B-1 | 27.64 | 27.64 | 27.64 | 27.64 | 27.64 | 27.64 | 27.64 | 27.64 | 27.64 |
| B-2 | 13.83 | 13.83 | 13.83 | 13.83 | 13.83 | 13.83 | 13.83 | 13.83 | 13.83 |
| C-1: Cl-HABI | 4.000 | 4.000 | 4.000 | 4.000 | 4.000 | 4.000 | 4.000 | 4.000 | 4.000 |
| D-1: BFBK | 0.075 | 0.075 | 0.075 | 0.075 | 0.075 | 0.075 | 0.075 | 0.075 | 0.075 |
| E-1: LCV | 0.400 | 0.400 | 0.400 | 0.400 | 0.400 | 0.400 | 0.400 | 0.400 | 0.400 |
| F-1: CBT | 0.014 | 0.014 | 0.014 | 0.014 | 0.014 | 0.014 | 0.014 | 0.014 | 0.014 |
| F-2: 5-Cl-BT | 0.014 | 0.014 | 0.014 | 0.014 | 0.014 | 0.014 | 0.014 | 0.014 | 0.014 |
| 17-3: Malachite Green | 0.029 | 0.029 | 0.029 | 0.029 | 0.029 | 0.029 | 0.029 | 0.029 | 0.029 |
| Developing time (sec) | 20 | 16 | 10 | 12 | 13 | 11 | 12 | 11 | 11 |
| Stripping time (sec) | 130 | 300 | 120 | 120 | 130 | 130 | 140 | 120 | 160 |
| Adhesion (μm) | 12 | 11 | 12 | 12 | 12 | 12 | 12 | 13 | 12 |
| Resolution (μm) | 10 | 9 | 10 | 10 | 10 | 10 | 10 | 11 | 10 |

TABLE 4

| Ingredient | CE3 | E8 | CE4 | E9 | CE5 | E10 | CE6 |
|---|---|---|---|---|---|---|---|
| A-10: St/MAA/MMA (20/25/55) | 54 | | | | | | |
| A-11: St/MAA/S-3b/MMA (20/25/25/30) | | 54 | | | | | |
| A-12: St/MAA/BzMA (20/25/55) | | | 54 | | | | |

TABLE 4-continued

| Ingredient | CE3 | E8 | CE4 | E9 | CE5 | E10 | CE6 |
|---|---|---|---|---|---|---|---|
| A-13: St/MAA/S-3b/BzMA (20/25/25/30) | | | | 54 | | | |
| A-14: St/MAA/BzMA (35/30/35) | | | | | 54 | | |
| A-15: St/MAA/S-3c/BzMA (35/30/20/15) | | | | | | 54 | |
| A-16: St/MAA/S-3e (35/30/35) | | | | | | | 54 |
| B-1 | 27.64 | 27.64 | 27.64 | 27.64 | 27.64 | 27.64 | 27.64 |
| B-7 | 13.83 | 13.83 | 13.83 | 13.83 | 13.83 | 13.83 | 13.83 |
| C-1: Cl-HABI | 4.000 | 4.000 | 4.000 | 4.000 | 4.000 | 4.000 | 4.000 |
| D-1: BFBK | 0.075 | 0.075 | 0.075 | 0.075 | 0.075 | 0.075 | 0.075 |
| E-1: LCV | 0.400 | 0.400 | 0.400 | 0.400 | 0.400 | 0.400 | 0.400 |
| F-1: CBT | 0.014 | 0.014 | 0.014 | 0.014 | 0.014 | 0.014 | 0.014 |
| F-2: 5-Cl-BT | 0.014 | 0.014 | 0.014 | 0.014 | 0.014 | 0.014 | 0.014 |
| F-3: Malachite Green | 0.029 | 0.029 | 0.029 | 0.029 | 0.029 | 0.029 | 0.029 |
| Developing time (sec) | 20 | 11 | 15 | 10 | 15 | 13 | 13 |
| Stripping time (sec) | 33 | 48 | 78 | 76 | 60 | 61 | 92 |
| Adhesion (µm) | 18 | 18 | 15 | 16 | 14 | 14 | 16 |
| Resolution (µm) | 19 | 18 | 13 | 15 | 12 | 13 | 15 |

From the dada listed in Table 3, the following are evident.

The resist specimens of E1 to E7 made from the present photosensitive compositions showed comparable adhesion and resolution with much faster developing time as compared to that of the resist specimens of CE1 or CE2. Furthermore, the resist specimens of E1 to E7 also demonstrated much faster stripping time than that of the resist specimens of CE2; the resist specimens of E1-E4 and E6 also demonstrated the same or slightly faster stripping time than that of the resist specimens of CE1.

Comparison between the data of CE1 and CE2, the resist specimens of CE2 showed better adhesion and resolution as well as a shorter developing time, while the stripping time is much longer than that of the CE1. Therefore, one can conclude that even with a slight variation of the binders, e.g., binder (A-1): St/MAA/MMA (55/25/20) versus binder (A-2): St/MAA/BzMA (55/25/20), it may result in the respective photosensitive composition and the photoresist made therefrom with unexpected positive or negative effects even when all other components and amounts are kept the same.

As shown in in Table 4, the resist specimens of E8 made from the present photosensitive compositions containing binder (A-11) showed comparable adhesion and resolution with much faster developing time as compared to that of the resist specimens of CE3. Analogously, the resist specimens of E9 also showed faster developing time with comparable adhesion and resolution.

Comparison between the data of CE5 and CE6 in Table 4, the resist specimens of CE6 showed not only decreased adhesion and resolution but also much longer stripping time. In contrast, the resist specimens of E10 made from the present photosensitive compositions containing binder (A-15) showed comparable adhesion, resolution, and stripping time with improved developing time as compared to that of the resist specimens of CE5 and CE6.

While the invention has been illustrated and described in typical embodiments, it is not intended to be limited to the details shown, since various modifications and substitutions are possible without departing from the spirit of the present invention. As such, modifications and equivalents of the invention herein disclosed may occur to persons skilled in the art using no more than routine experimentation, and all such modifications and equivalents are believed to be within the spirit and scope of the invention as defined by the following claims.

What is claimed is:

1. A photosensitive composition, comprising:
(a) a polymeric binder consisting of:
    10-70% by weight of a structural unit represented by Formula 1,

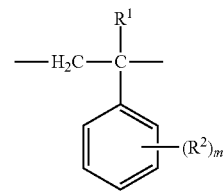

15-35% by weight of a structural unit represented by Formula 2, and

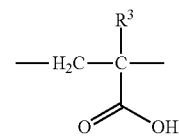

5-60% by weight of at least one structural unit represented by Formula 3,

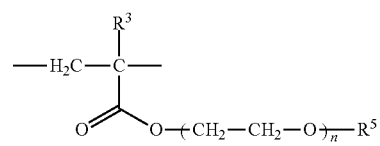

wherein
$R^1$, $R^3$, and $R^4$ each independently is H or $CH_3$;
$R^2$ is $C_1$-$C_3$ alkyl, $C_1$-$C_3$ alkoxy, $-NH_2$, or halogen;
m is an integer of 0-5, and when m is 2-5, the multiple $R^2$ groups may be the same or different;
$R^5$ is $C_1$-$C_5$, alkyl, benzyl, or $C(O)CH_2C(O)CH_3$, and n is an integer of 0-12;
wherein the at least one structural unit represented by Formula 3 comprises a structural unit represented by Formula 3 where n is other than 0;

the weight ratio of each structural unit is based on the total weight of the polymerizable precursors for constituting the polymeric binder;
(b) a polymerizable compound;
(c) a photoinitiator; and
(d) a photosensitizer.

2. The photosensitive composition according to claim 1, wherein the photoinitiator (c) comprises a hexaarylbiimidazole compound.

3. The photosensitive composition according to claim 1, further comprising a hydrogen donor (e).

4. The photosensitive composition according to claim 1, wherein the polymeric binder (a) has a weight-average molecular weight ($M_w$) in the range of 25,000-100,000.

5. The photosensitive composition according to claim 1, comprising:
(a) 30-70% by weight of at least one polymeric binder;
(b) 10-70% by weight of at least one polymerizable compound;
(c) 0.1-20% by weight of at least one photoinitiator;
(d) 0.01-1% by weight of at least one photosensitizer;
(e) 0-2% by weight of at least one hydrogen donor; and
(f) 0-10% by weight of other additives;
wherein the % is based on the total weight of the photosensitive composition.

6. A photosensitive dry film comprising a support film and a photosensitive layer formed on the support film, wherein the photosensitive layer comprises the photosensitive composition according to claim 1 or claim 5.

7. A method for forming a resist pattern on a substrate comprising:
i) forming an imageable layer comprising the photosensitive composition according to claim 1 or claim 5 on a substrate;
ii) imagewise exposing to active light rays to produce exposed and non-exposed areas in the imageable layer; and
iii) developing the resist pattern by removing the unexposed sections of the imageable layer.

8. A method for producing a printed wiring board comprising: etching or plating a substrate having a resist pattern formed according to the method of claim 7 to form a conductor pattern.

9. A method for producing a semiconductor package comprising: plating the substrate having a resist pattern formed according to the method of claim 7.

10. A method for producing a bump comprising: plating the substrate having a resist pattern formed according to the method of claim 7.

* * * * *